(12) United States Patent
Nelle et al.

(10) Patent No.: US 9,218,960 B2
(45) Date of Patent: Dec. 22, 2015

(54) METHOD OF MANUFACTURING A SEMICONDUCTOR DEVICE INCLUDING A STRESS RELIEF LAYER

(71) Applicant: Infineon Technologies AG, Neubiberg (DE)

(72) Inventors: Peter Nelle, Munich (DE); Uwe Schmalzbauer, Hoehenklrchen-Siegertsbrunn (DE); Juergen Holzmueller, Vogach (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/319,534

(22) Filed: Jun. 30, 2014

(65) Prior Publication Data

US 2014/0315391 A1  Oct. 23, 2014

Related U.S. Application Data

(62) Division of application No. 13/571,462, filed on Aug. 10, 2012, now Pat. No. 8,803,297.

(51) Int. Cl.

| | |
|---|---|
| *H01L 21/311* | (2006.01) |
| *H01L 21/02* | (2006.01) |
| *H01L 29/06* | (2006.01) |
| *H01L 21/78* | (2006.01) |
| *H01L 23/29* | (2006.01) |
| *H01L 23/31* | (2006.01) |
| *H01L 23/00* | (2006.01) |

(52) U.S. Cl.
CPC ........ *H01L 21/02359* (2013.01); *H01L 21/022* (2013.01); *H01L 21/0214* (2013.01); *H01L 21/0217* (2013.01); *H01L 21/02129* (2013.01); *H01L 21/02164* (2013.01); *H01L 21/78* (2013.01); *H01L 23/29* (2013.01); *H01L 23/3192* (2013.01); *H01L 23/562* (2013.01); *H01L 29/0603* (2013.01); *H01L 2924/0002* (2013.01)

(58) Field of Classification Search
CPC .................. H01L 21/02359; H01L 21/02164; H01L 21/0217; H01L 21/0214; H01L 21/02129
USPC ........... 438/703; 257/368, 341, 642, 643, 401
See application file for complete search history.

(56) References Cited

U.S. PATENT DOCUMENTS

| | | | |
|---|---|---|---|
| 8,299,611 B2 * | 10/2012 | Arvin et al. | .................... 257/738 |
| 2002/0100962 A1 | 8/2002 | Joshi | |
| 2003/0166341 A1 * | 9/2003 | Aizawa | .......................... 438/694 |

(Continued)

FOREIGN PATENT DOCUMENTS

| | | |
|---|---|---|
| DE | 10343084 B4 | 7/2006 |
| JP | H06275713 A | 9/1994 |

*Primary Examiner* — Bilkis Jahan
(74) *Attorney, Agent, or Firm* — Murphy, Bilak & Homiller, PLLC

(57) ABSTRACT

A method of manufacturing a semiconductor device includes providing a layered structure having a hard dielectric layer containing a first dielectric material having a Young's modulus greater than 10 GPa in a central portion of a main surface of a main body comprising a single crystalline semiconductor body, and providing a dielectric stress relief layer containing a second dielectric material having a lower Young's modulus than the first dielectric material, the stress relief layer covering the layered structure and extending beyond an outer edge of the layered structure.

7 Claims, 7 Drawing Sheets

(56) References Cited

U.S. PATENT DOCUMENTS

2004/0219724 A1* 11/2004 Park et al. .................... 438/197
2008/0006910 A1    1/2008 Miyata et al.
2008/0237226 A1   10/2008 Yong
2008/0237726 A1* 10/2008 Dyer ............................. 257/369
2011/0095392 A1*  4/2011 Wahl et al. ................... 257/503

* cited by examiner

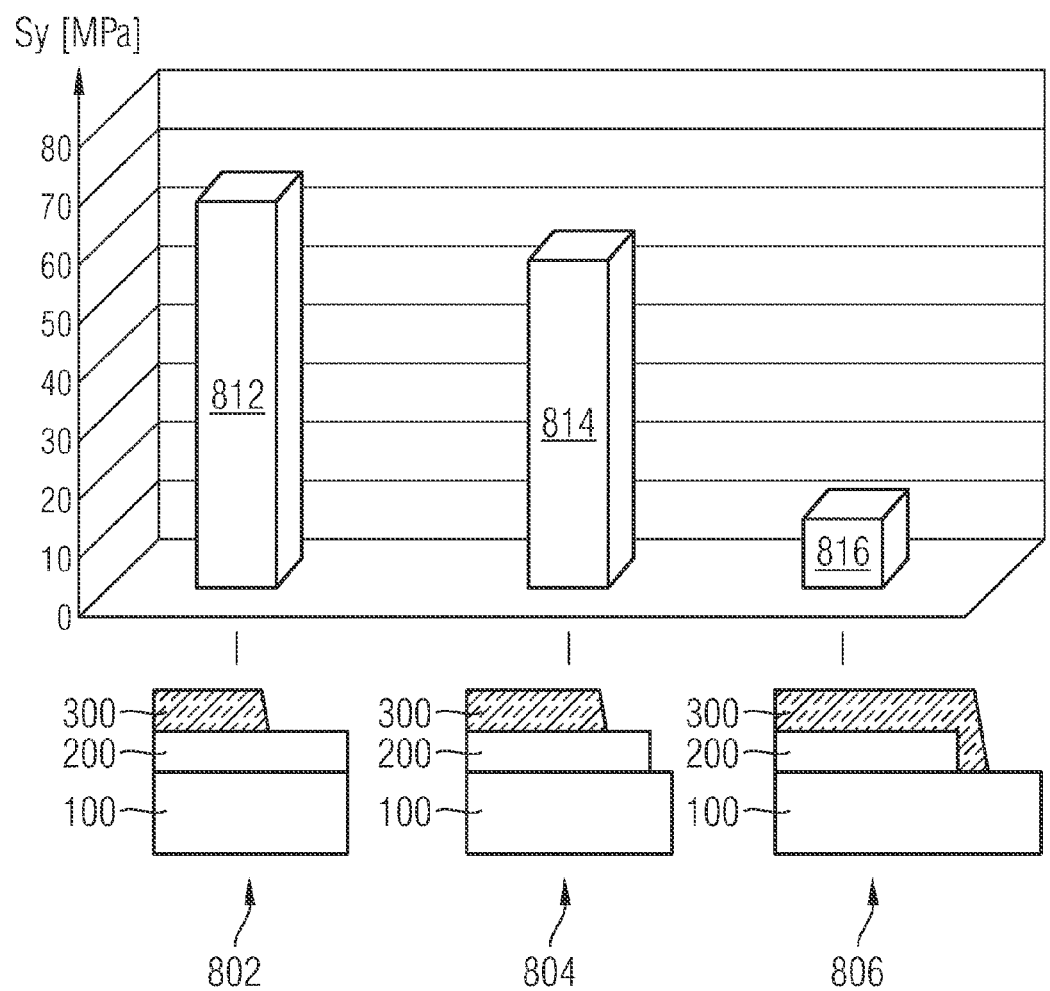

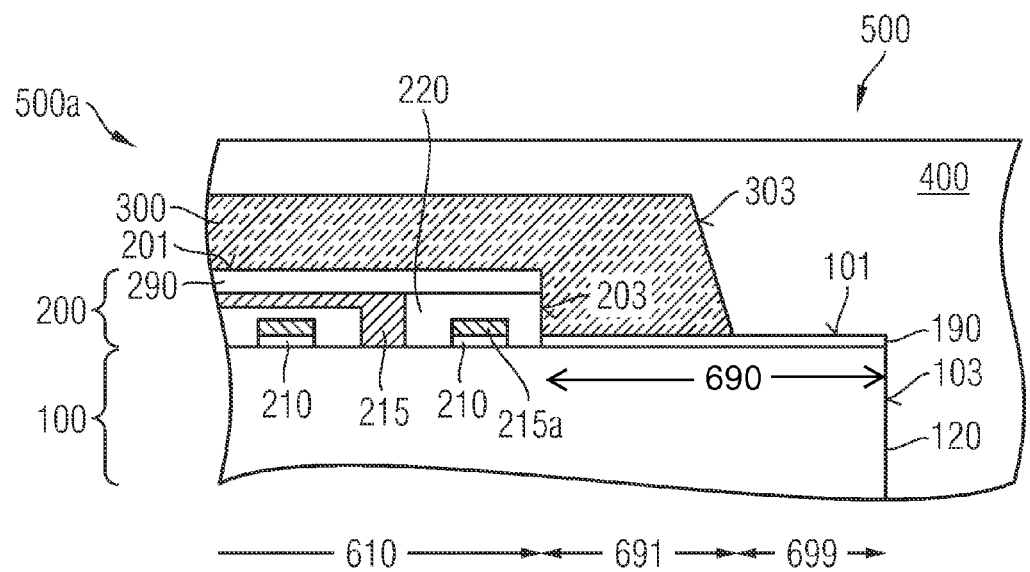
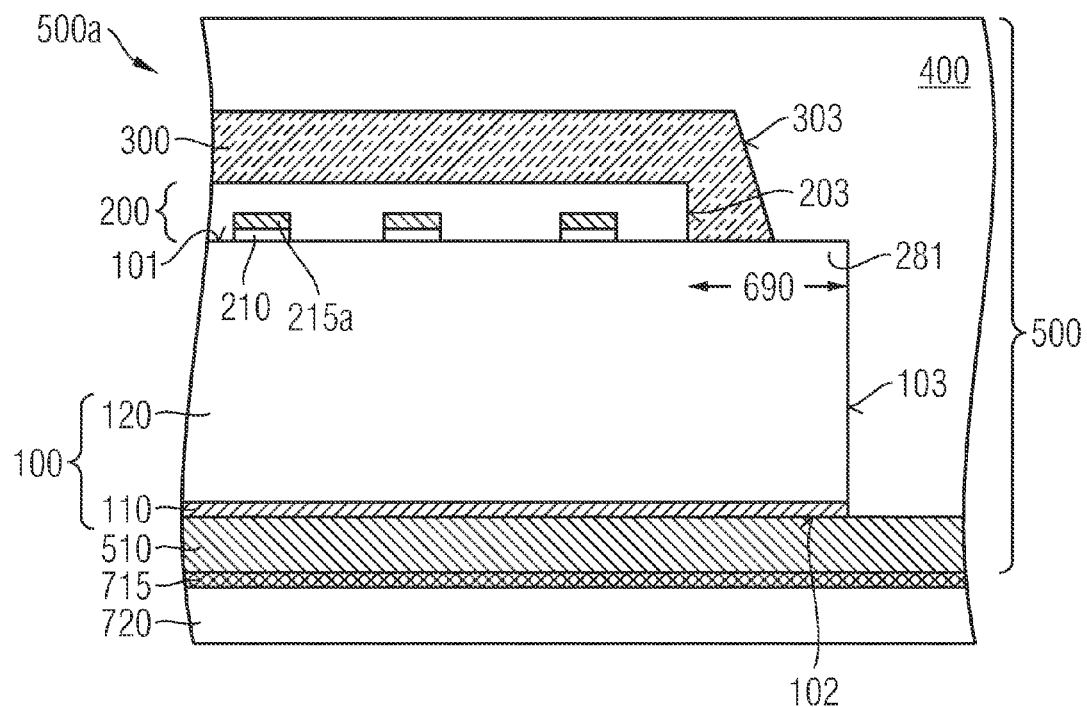

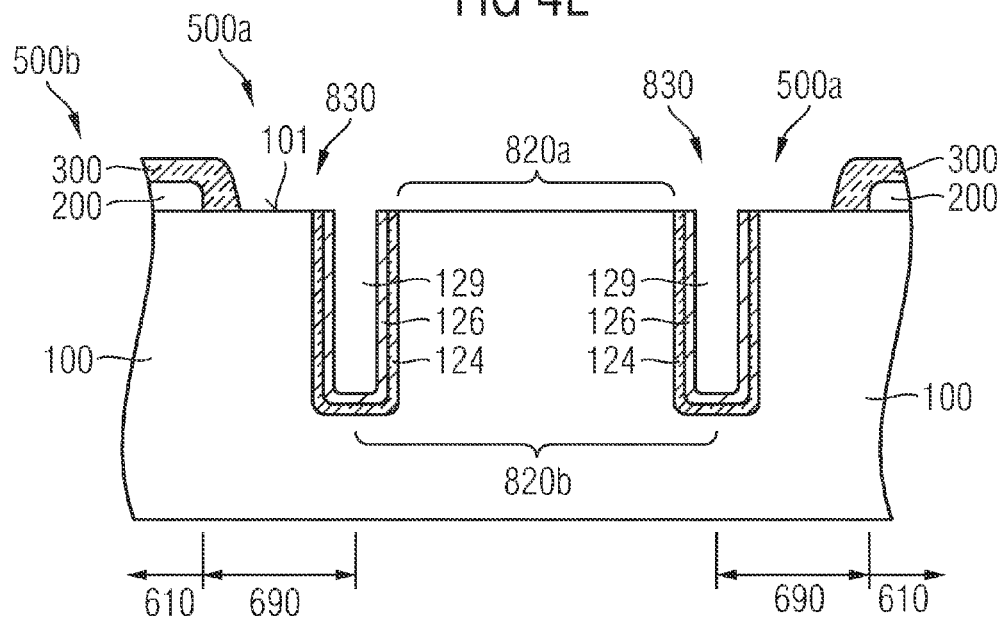

502 — Providing a layered structure containing a first dielectric material having a Young's modulus greater than 10 GPa in a central portion of a main surface of a main body 504 — Providing a stress relief layer containing a second dielectric material having a lower Young's modulus to cover the layered structure and to extend beyond an outer edge of the layered structure

METHOD OF MANUFACTURING A SEMICONDUCTOR DEVICE INCLUDING A STRESS RELIEF LAYER

PRIORITY CLAIM

This application is a Divisional of U.S. application Ser. No. 13/571,462, filed on 10 Aug. 2012, the content of said application incorporated herein by reference in its entirety.

BACKGROUND

Passivation layers, for example plasma oxide or plasma nitride layers, protect semiconductor dies against corrosion and mechanical damages. Typically a passivation layer is provided after patterning the topmost metallization or wiring layer. A stress relief layer, e.g., a polyimide layer, improves adhesion between the passivation layer and a molding mass encapsulating the semiconductor die. It is desirable to improve the reliability of semiconductor devices.

SUMMARY

According to an embodiment, a semiconductor device includes a main body that includes a single crystalline semiconductor body. A layered structure directly adjoins a central portion of a main surface of the main body and includes a hard dielectric layer provided from a first dielectric material with Young's modulus greater than 10 gigapascals (GPa). A dielectric stress relief layer directly adjoins the layered structure opposite to the main body and extends beyond an outer edge of the layered structure.

According to an embodiment providing a method of manufacturing a semiconductor device, a layered structure is provided in a central portion of a main surface of a main body that includes a single crystalline semiconductor body. The layered structure includes a hard dielectric layer that contains a first dielectric material with a Young's modulus greater than 10 GPa. A dielectric stress relief layer is provided to cover the layered structure and to extend beyond an outer edge of the layered structure.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2D is a schematic diagram visualizing the stress reduction achieved by the embodiments.

FIG. 3A is a schematic cross-sectional view of an edge portion of a semiconductor device in accordance with an embodiment providing a stress relief layer with a portion in contact with a non-single crystalline surface.

FIG. 3B is a schematic cross-sectional view of a portion of an electronic assembly in accordance with another embodiment.

FIG. 4E is a schematic cross-sectional view of a kerf portion of a semiconductor substrate in accordance with an embodiment providing partially filled circumferential trench structures.

FIG. 5 is a simplified flow chart illustrating a method of manufacturing a semiconductor device according to a further embodiment.

DETAILED DESCRIPTION

In the following detailed description, reference is made to the accompanying drawings, which form a part hereof and in which are shown by way of illustration specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

Figure 1:
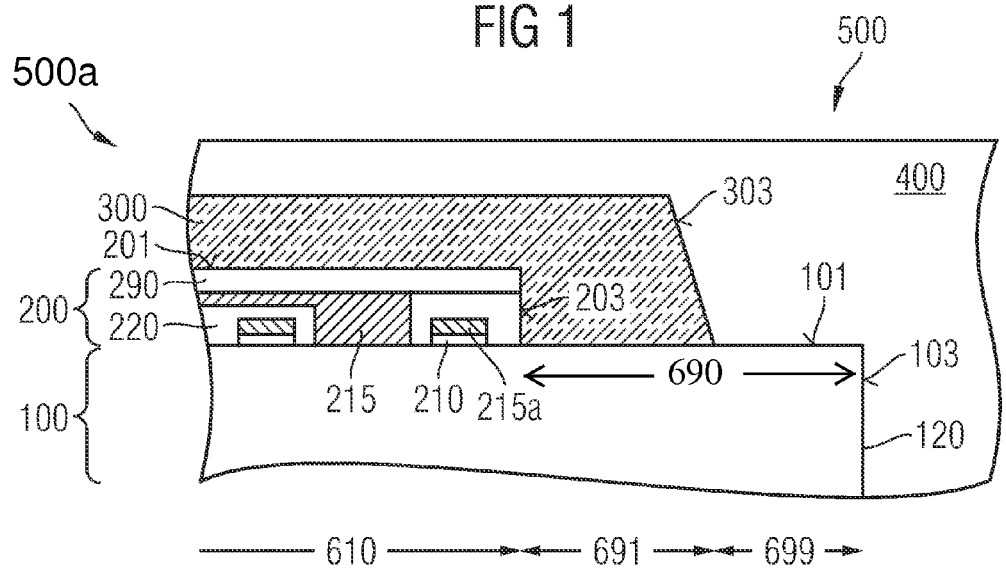
FIG. 1 is a schematic cross-sectional view of an edge portion of a semiconductor device in accordance with an embodiment providing a stress relief layer with a portion in contact with a single crystalline semiconductor surface.

FIG. 1 shows an edge portion 690 of a semiconductor die 500a of a semiconductor device 500 with a main body 100 having a flat main surface 101. The main body 100 includes a single crystalline semiconductor body 120 formed from a single crystalline semiconductor material, for example silicon Si, silicon carbide SiC, germanium Ge, silicon germanium SiGe, gallium nitride GaN or gallium arsenide GaAs. The semiconductor body 120 may include doped layers and zones of both conductivity types as well as further conductive and insulating structures.

In a cell area of the main body 100 corresponding to a central portion 610 of the main surface 101, elements of one or more diode or field effect transistor (FET) structures may be provided that define the function of the semiconductor device 500. The semiconductor device 500 may be, for example, a semiconductor diode, an IGFET (insulated gate field effect transistor), for example an MOSFET (metal oxide semiconductor field effect transistor) in the usual meaning including FETs with metal and with non-metal gate electrodes, or an IGBT (insulated gate bipolar transistor). Each diode or field effect transistor structure may include a plurality of cells arranged in one or more cell arrays. The semiconductor device 500 may be a super junction device.

The illustrated embodiment provides gate electrodes 215a provided at a distance to the main body 100. According to another embodiments, the semiconductor body 120 may include gate trench structures extending from the main surface 101 into the semiconductor body 120, the gate trench structures including gate electrode structures, gate dielectrics, field electrodes and insulator structures insulating the gate electrode structures and the field electrodes from each other and the semiconductor material embedding the gate trench structures.

A layered structure 200 directly adjoins the central portion 610 of the main surface 101. The layered structure 200 includes one or more dielectric layers and may include conductive structures 215, for example gate electrodes 215a, provided on the main surface 101 and/or in one or more wiring planes at a distance to the main surface 101. According to the illustrated embodiment, the layered structure 200 may include, at least in sections, a gate dielectric 210 formed below the gate electrodes 215a. The gate dielectric 210 may be a thermally grown semiconductor oxide, such as a silicon oxide in the case of a silicon single crystalline semiconductor body 120. One or more interlayer dielectrics 220 insulate neighboring conductive structures 215, 215a within the same wiring plane and may separate neighboring wiring planes.

The layered structure 200 may include a main dielectric layer provided from BSG (boron silicate glass), PSG (phosphorus silicate glass) or BPSG (boron phosphorus silicate glass). A thin silicon oxide layer deposited by using, for example, TEOS (tetraethylorthosilane) as precursor material, may be arranged between the main dielectric layer and the main surface 101.

The layered structure 200 includes at least one hard dielectric layer 290 provided from a first dielectric material having a Young's modulus greater than 10 GPa. According to an embodiment, the first dielectric material is an inorganic dielectric. For example, the hard dielectric layer 290 is a passivation layer, such as a silicon oxide layer, a silicon nitride layer, or a silicon oxynitride layer provided by chemical vapor deposition and having a thickness of at least 0.2 and at most 2.0 micrometer.

A stress relief layer 300 directly adjoins a layer surface 201 of the layered structure 200, opposite to the main body 100, and extends beyond the outer edge of the layered structure 200. The stress relief layer 300 consists of or contains a second dielectric material that has a Young's modulus at most half of the Young's modulus of the first dielectric material forming the first dielectric layer 290. A first portion of the stress relief layer 300 adjoining the layer surface 201 and a second portion adjoining an outer surface 203 of the layered structure 200 tilted to the layer surface 201 may be of the same second dielectric material or may be of different second dielectric materials.

According to an embodiment, Young's modulus of the second dielectric material(s) is at most a tenth of Young's modulus of the first dielectric material. Each second dielectric material may be a polymer with Young's modulus being less than 10 GPa. By way of example, each second dielectric material is or contains polyimide, benzocyclobutene, polynorbornene, polystyrene, polycarbonate, parylene, epoxy resin or a mixture therefrom. In one particular embodiment, for example, the first dielectric material is a silicon oxide with a Young's modulus of about 80 GPa and the second dielectric material is polyimide with a Young's modulus of about 3.2 GPa.

The stress relief layer 300 covers the outer surface 203 of the layered structure 200, wherein the outer surface 203 is tilted to the layer surface 201. According to an embodiment, the outer surface 203 is perpendicular to the layer surface 201. The stress relief layer 300 covers an inner edge portion 691 of the main surface 101 surrounding the central portion 610 and forming part of edge portion 690 between the central portion 610 and an outer edge 103 of the main body 100. The distance between an outer edge 303 of the stress relief layer 300 and the outer surface 203 of the layered structure 200 may be at least 3 micrometer, and in a particular embodiment may be at least 5 micrometer. The distance between the outer edge 303 of the stress relief layer 300 and the outer edge 103 of the main body 100 may be at least 5 micrometer, and in a particular embodiment may be at least 10 micrometer. The semiconductor device 500 may further include a molding mass 400 encapsulating the semiconductor die 500a. The material of the molding mass 400 may be a ceramic or a plastic.

Drawing back the outer surface 203 of the layered structure 200 from the outer edge 103 of the main body 100, i.e., providing the layered structure 200 at a distance to the outer edge 103, allows for forming the outer surface 203 using an etch process. In contrast to a sawing process, etch processes do not leave cracks in the etched sidewalls, such that the outer surface 203 is typically without cracks. The outer surface 203 of the layered structure 200 is not adversely affected by sawing a semiconductor substrate to obtain singulated semiconductor dies 500a, wherein in the semiconductor substrate a plurality of identical semiconductor dies 500a are formed. Extending the stress relief layer 300 beyond the edge of the layered structure 200 protects the outer surface 203 against thermo-mechanic stress induced by subsequent rapid thermal processing steps, such as soldering.

Figure 2A:
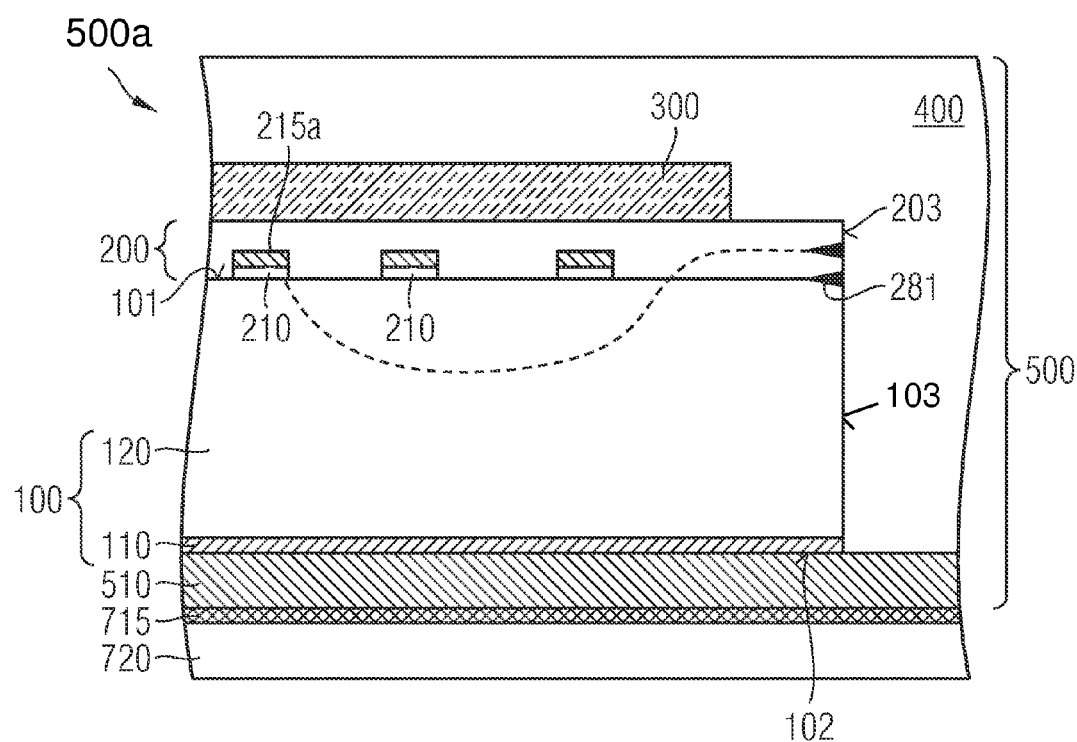
FIG. 2A is a schematic cross-sectional view of an electronic assembly according to a comparative example.

FIG. 2A illustrates a destructive mechanism induced by initially non-critical sawing features. A layered structure 200 is provided on a main surface 101 of a main body 100 including a semiconductor body 120. The layered structure 200 includes conductive structures 215, including, inter alia, at least one gate electrode 215a and a gate dielectric 210 separating the gate electrode 215a and the single crystalline semiconductor body 120. The layered structure 200 covers the main surface 101 completely such that an outer surface 203 of the layered structure 200 is flush with an outer edge 103 of the main body 100. A stress relief layer 300 is deposited on at least a portion of the layered structure 200. A semiconductor die 500a including the main body 100, the layered structure 200 and the stress relief layer 300 may be obtained by sawing a semiconductor substrate, providing a plurality of identical semiconductor dies 500a.

The sawing may induce small cracks 281 along the outer surface 203 of the layered structure 200. The small cracks 281 typically do not exceed a length of 10 to 15 micrometers and do not necessarily adversely affect the functionality of the semiconductor die 500a, such that the singulated semiconductor die 500a may initially pass all tests for functionality.

The semiconductor die 500a may be mounted on a heat slug 510 directly contacting a backside surface 102 of the main body 100 opposite to the main surface 101, wherein the main body 100 may or may not include a backside metallization 110 along the backside surface 102. The heat slug 510 may be made of copper Cu or an alloy including copper, by way of example. A molding mass 400 encapsulates the semiconductor die 500a and may expose at least portions of the heat slug 510. The molding mass 400 is a plastic or a ceramic material.

A semiconductor device 500 provided by the encapsulated semiconductor die 500a is mounted on a PCB (printed circuit board) 720 by soldering, resulting in a solder layer 715 between the heat slug 510 and the PCB 720. During soldering at temperatures of, for example, 260 degree Celsius, the molding mass 400 expands, inducing a tensile stress along the outer surface 203 of the layered structure 200. The induced tensile stress is a function of the solder temperature, especially as the solder temperature ramps up.

Figure 2B:
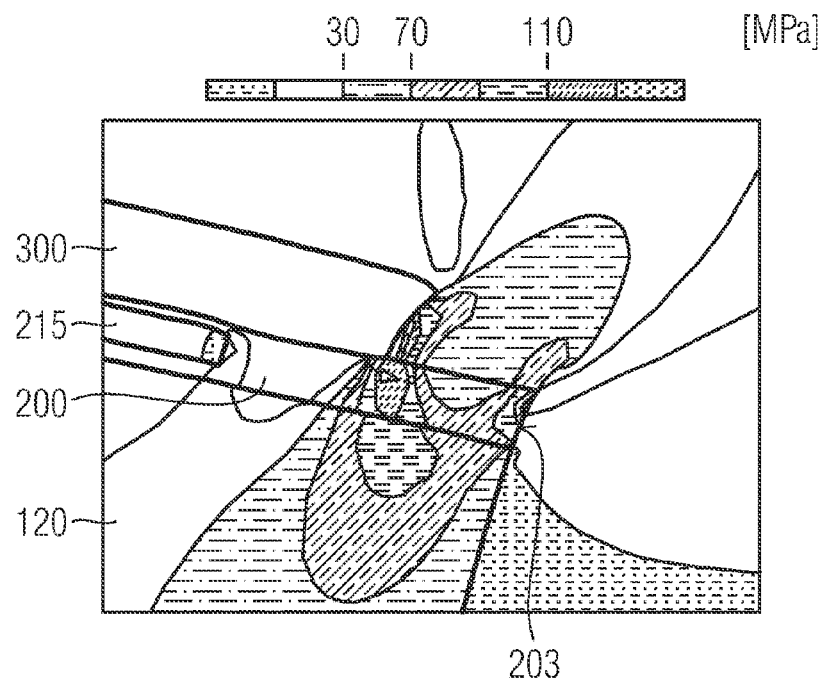
FIG. 2B is a schematic diagram illustrating a stress gradient along a device edge according to a comparative example.

FIG. 2B shows that for the arrangement of FIG. 2A the effective tensile stress may amount to 100 megapascals (MPa) at a fast heat up of 200 degree Celsius per second. The tensile stress may pull apart portions of the layered structure 200 on both sides of an initially non-critical crack 281 such that the crack propagates up to several 100 micrometer in a direction parallel to the main surface 101 into the layered structure 200, as indicated by the dotted line in FIG. 2A. The propagating crack may enter the semiconductor body 120 for several tens of micrometers, and may exit the semiconductor body 120, for example, below a gate dielectric 210. Propagating into the gate dielectric, the crack may damage the gate dielectric 210. As a result, the semiconductor device 500 is defective.

Drawing the outer surface 203 of the layered structure 200 back from the outer edge 103 of the semiconductor die 500a, along which the semiconductor die 500a is sawn, reduces initial damages of the layered structure 200.

Figure 2C:
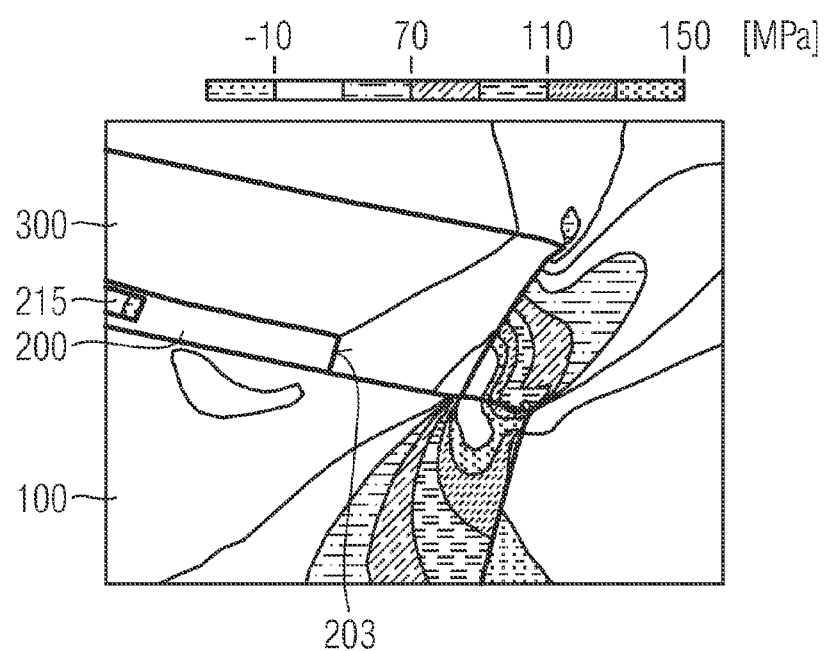
FIG. 2C is a schematic diagram illustrating a stress gradient along a device edge in accordance with an embodiment.

Extending the stress relief layer 300 beyond the outer surface 203 of the layered structure 200 significantly reduces the stress that is effective on the outer surface 203, as shown in FIG. 2C. As a result of both measures, the reliability of the semiconductor device 500 is significantly improved.

FIG. 2D shows the tensile stress Sy in MPa at the edge of a layered structure 200 embodied by a silicon oxide layer with a thickness of 2 micrometer. In a conventional arrangement 802, the tensile stress Sy is greater than 60 MPa, as shown in column 812. Drawing back the outer edge of the silicon oxide layer 200a by 20 micrometer, as for arrangement 804, reduces the maximum tensile stress by about 10 GPa, as shown by column 814. Drawing back the outer edge of the silicon oxide layer 200a by 30 micrometer and extending a stress relief layer 300 embodied by a polyimide layer beyond the edge of the silicon oxide layer 200a by 10 micrometer, as for arrangement 806, approximately reduces the maximum stress by a factor 10, as shown by col column 816.

FIG. 3A refers to an embodiment that differs from the embodiment of FIG. 1 in that the main body 100 includes an additional layer 190 between the main surface 101 and the semiconductor body 120. The additional layer 190 may be formed exclusively in the inner edge portion 691, exclusively in the outer edge portion 699 or in the complete edge portion 690. The additional layer 190 may be a sub-layer of the layered structure 200. According to an embodiment, the additional layer 190 may be a thin dielectric layer with a thickness of less than 200 nanometer. For example, the additional layer 190 may be a thin silicon nitride layer or a thin silicon oxide layer, such as a native oxide or a terminal oxide.

The electronic assembly FIG. 3B differs from the electronic assembly of FIG. 2A in that the layered structure 200 is absent in an edge portion 690 of the main surface 101 and in that the stress relief layer 300 extends over the outer edge 203 of the layered structure 200. Since damages induced by sawing are avoided in the layered structures 200 and since the stress relief layer 300 effectively protects the outer edge 203 from tensile stress during soldering the semiconductor device 500 onto the PCB 720, fewer cracks occur in the layered structure 200 and propagation of the cracks is suppressed. The electronic assembly 700 shows fewer failures during operation.

The semiconductor devices 500 of FIGS. 1, 3A and 3B may be manufactured on a semiconductor substrate, such as a silicon wafer, with a plurality of device regions that are arranged in a matrix and separated by a kerf grid (kerf frame). The kerf frame may include PCM (process control monitoring) features, test circuits and/or lithographic marks. In each device region, a semiconductor die 500a is formed by providing, in a central portion of each of the device regions, a layered structure that includes the hard dielectric layer and by providing, in each device region, a stress relief layer at a distance to the kerf frame. In each device region, the stress relief layer covers the layered structure and extends beyond an outer edge of the layered structure.

Figure 4A:
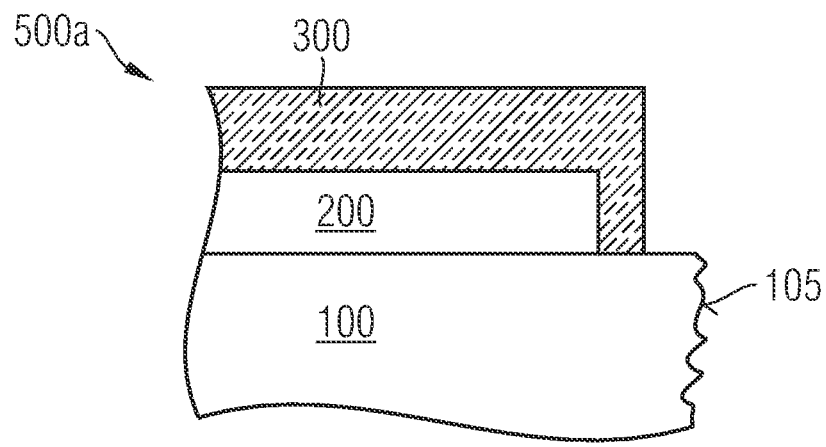
FIG. 4A is a schematic cross-sectional view of an edge portion of a semiconductor device according to an embodiment providing singulation of semiconductor devices by sawing from a main surface.

According to an embodiment, the semiconductor substrate is sawn along the kerf frame, for singulating the semiconductor dies. As shown in FIG. 4A, the resulting rough edge surface 105 of the main body 100, including the semiconductor body 120, has a surface roughness greater than 0.1 micrometer.

According to another embodiment, an etch or laser cut process singulates the semiconductor dies 500a from the semiconductor substrate. The etch and laser cut processes leave a smooth edge surface 106 with significantly less surface roughness, e.g., lower than 0.1 micrometer, as indicated in FIG. 4B.

PCM features, test circuits and lithographic marks may be at least partly removed by a lift-off process using HF or a plasma-enhanced etch process for completely etching through the semiconductor substrate, or by a saving process.

Figure 4B:
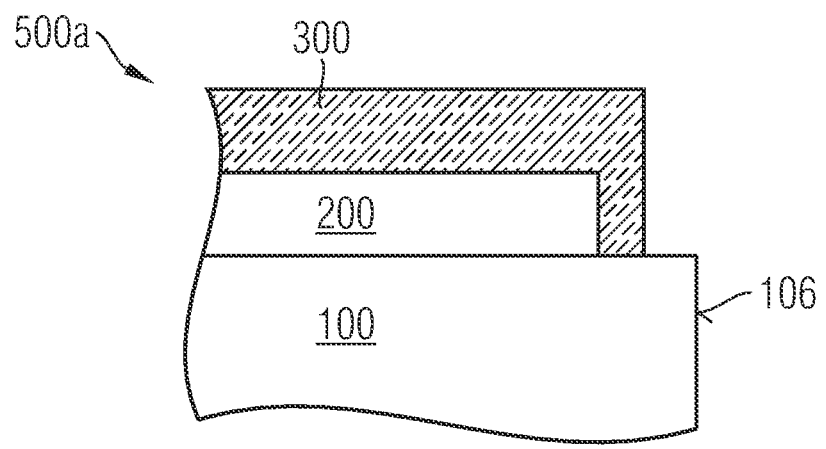
FIG. 4B is a schematic cross-sectional view of an edge portion of a semiconductor device according to an embodiment providing singulation of semiconductor dies by etching from a main surface.

According to another embodiment, an example of which is illustrated in FIG. 4B, the semiconductor die 500a includes a circumferential trench 122 formed completely in the outer edge portion 699 or in parts in the outer edge portion 699 and a kerf frame 820. The circumferential trench 122 may extend from the main surface 101 into the main body 100. The depth of the circumferential trench 122 may be at least 0.1 and at most 60 micrometer. The depth and width of the circumferential trenches 122 may vary. Trenches with wide openings may be completely or partially filled, with conformally deposited layers, for example. According to an embodiment, the center of the circumferential trenches 122 is a void or space. The circumferential trenches 122 stop cracks from propagating from sawing defects at the edge surface 105, 106 into the main body 100.

Figure 4C:
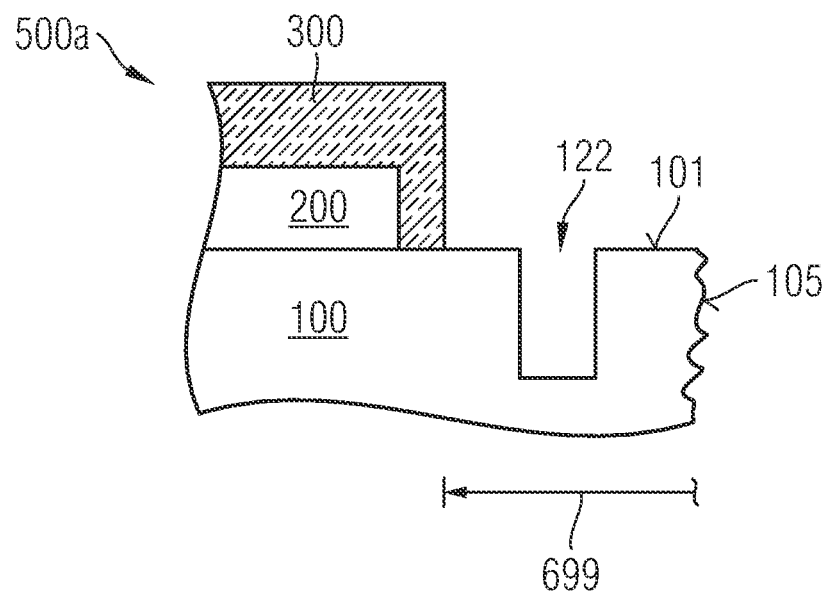
FIG. 4C is a schematic cross-sectional view of an edge portion of a semiconductor device according to an embodiment providing singulation of semiconductor dies by sawing outside a circumferential trench structure.

As shown in FIG. 4C, the semiconductor substrate may be sawn outside the circumferential trenches 122, leaving a rough edge surface 105 between the main surface 101 and the opposing backside surface.

According to another embodiment sawing is performed over the whole width of the kerf frame and cuts both neighboring trenches, respectively. The trenches may be cut in a central, void section such that the trench sidewalls remain sound and untouched.

Figure 4D:
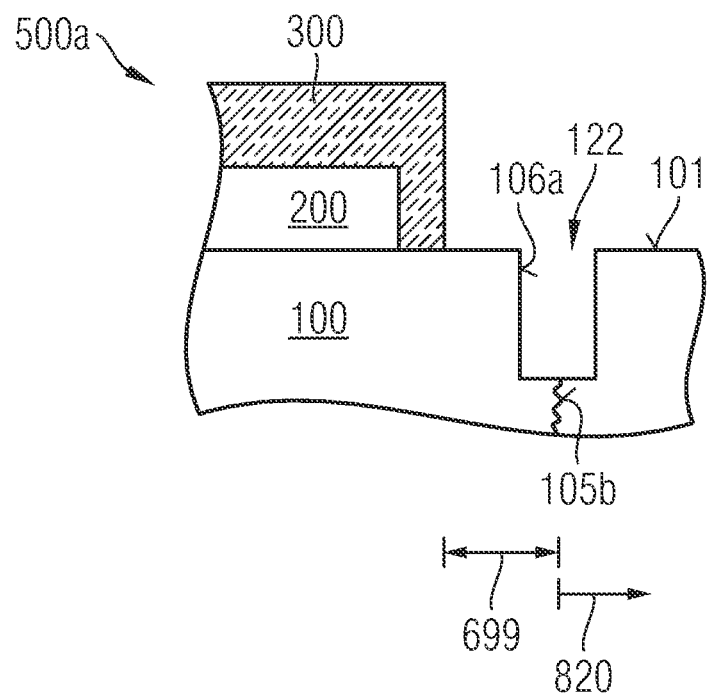
FIG. 4D is a schematic cross-sectional view of an edge portion of a semiconductor device according to an embodiment providing singulation of semiconductor dies by sawing through circumferential trench structures.

As shown in FIG. 4D, a first portion 106a of the edge surface resulting from the trench structure 122 is smooth and a second portion 105b resulting from sawing shows a surface roughness greater than 0.1 micrometer. An edge surface 105, 106 of the main body 100 perpendicular to the main surface 101 provides a first portion between the main surface 101 and a step distance given by the step bottom as well as a second portion between the step distance and a backside surface opposing the main surface 101. The trench structure 122 may extend from the main surface 101 or from the opposing backside surface into the main body 100. In each case, in a narrower one of the first and second portions corresponding to the trench structure 122, the roughness is at most 0.1 micrometer and in a wider one of the first and second portions outside the trench structures 122 the roughness is greater than 0.1 micrometer.

An outer surface without initial damage does not induce cracks. The sawing area may have a width of 40 to 100 micrometer, and the width of the trenches may range from 5 to 20 micrometers, by way of example. The process may be combined with IC-technologies providing trenches for other reasons, for example smart transistor technologies combining power transistor technology with logic circuits on the same semiconductor die 500a.

FIG. 4E shows a semiconductor substrate 500b with a kerf frame 820a, 820b separating two device regions 830. Each device region 830 provides a semiconductor die 500a. Each semiconductor die 500a includes a central portion 610 with a layered structure 200 formed on a main body 100. A stress relief layer 300 extends over edges of the layered structure 200 into edge portions 690 surrounding the central portions 610, respectively. In the edge portions 690, circumferential trenches 122 extend from a main surface 101 into the respective main body 100 and surround the central portions 610. A conformal oxide layer 124 and a conformal polysilicon layer 126 may line the sidewalls and bottoms of the circumferential trenches 122 and may leave a void 129 in the center of the circumferential trenches 122. According to an embodiment, the kerf frame 820a is a part of or the complete portion of the semiconductor substrate 500b between two neighboring circumferential trenches 122. According to another embodiment, the kerf frame 820b includes the inner sidewalls of the circumferential trenches 122 oriented to the neighboring semiconductor die 500a. The kerf frame 820a, 820b may have a width of about 50 to 60 micrometer and the circumferential trenches 122 may have a width of about 5 to 20 micrometer.

According to FIG. 5 a method of manufacturing a semiconductor device includes providing a layered structure in a central portion of a main surface of a main body that includes a single crystalline semiconductor body (502). The layered structure includes a hard dielectric layer that contains a first dielectric material with a Young's modulus greater than 10 GPa. A stress relief layer with a lower Young's modulus is provided to cover the layered structure and to extend beyond an outer edge of the layered structure (504). The stress relief layer may contain a second dielectric material with a Young's modulus at most half of Young's modulus of the first dielectric material.

According to an embodiment, the stress relief layer may be provided to cover at least an inner edge portion directly adjoining the central portion of the main surface. Providing the layered structure may include depositing the hard dielectric layer containing the first dielectric material and removing the hard dielectric layer in the edge portion. This may be done, for example, by a masked etch process. Other than a sawing process, plasma etch processes do not leave cracks in the etched sidewalls. Providing the stress relief layer may include depositing an unpatterned stress relief layer and removing a portion of the unpatterned stress relief layer from the outer edge portion. The first dielectric material may be silicon oxide, silicon nitride, silicon oxynitride, undoped silicate glass, boron silicate glass, phosphorus silicate glass or boron phosphorus silicate glass, by way of example. Examples for the second dielectric material are polyimide, benzocyclobutene, polynorbornene, polystyrene, polycarbonate, parylene, and epoxy resin.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   providing a layered structure comprising a hard dielectric layer containing a first dielectric material having a Young's modulus greater than 10 GPa on a central portion of a main surface of a main body comprising a single crystalline semiconductor body, the layered structure being absent in an edge portion of the main surface between the central portion and an outer edge of the main body, the outer edge connecting the main surface and a backside surface opposite to the main surface; and
   providing a dielectric stress relief layer containing a second dielectric material having a lower Young's modulus than the first dielectric material, the stress relief layer covering the layered structure and extending beyond an outer edge of the layered structure.

2. The method according to claim 1, wherein the second dielectric material has a Young's modulus at most half of the Young's modulus of the first dielectric material.

3. The method according to claim 1, wherein the dielectric stress relief layer is provided to cover at least an inner edge portion directly adjoining the central portion of the main surface.

4. The method according to claim 1, wherein providing the layered structure comprises depositing the first dielectric material and removing the first dielectric material in an edge portion by an etch process.

5. The method according to claim 1, wherein providing the stress relief layer comprises depositing an unpatterned stress relief layer and removing a portion of the unpatterned stress relief layer from the outer edge.

6. The method according to claim 1, wherein the first dielectric material is selected from a group comprising silicon oxide, silicon nitride, silicon oxynitride, undoped silicate glass, boron silicate glass, phosphorus silicate glass and boron phosphorus silicate glass.

7. The method according to claim 1, wherein the second dielectric material is selected from a group comprising polyimide, benzocyclobutene, polynorbornene, polystyrene, polycarbonate, parylene, and epoxy resin.

* * * * *